(12) United States Patent
Sugita et al.

(10) Patent No.: US 7,033,643 B2
(45) Date of Patent: Apr. 25, 2006

(54) PROCESS OF MANUFACTURING A COATED BODY

(75) Inventors: Hiroaki Sugita, Toyokawa (JP);
Masatoshi Sakurai, Toyokawa (JP);
Kenichiro Yamakawa, Toyohashi (JP);
Takahiro Yamamoto, Toyokawa (JP)

(73) Assignee: OSG Corporation, Toyokawa (JP)

( * ) Notice: Subject to any disclaimer, the term of this patent is extended or adjusted under 35 U.S.C. 154(b) by 205 days.

(21) Appl. No.: 10/667,493

(22) Filed: Sep. 23, 2003

(65) Prior Publication Data

US 2004/0253379 A1  Dec. 16, 2004

(30) Foreign Application Priority Data

Jun. 13, 2003 (JP) ............................. 2003-170052

(51) Int. Cl.
*B05D 3/12* (2006.01)

(52) U.S. Cl. ...................... 427/348; 427/355; 427/198; 204/192.1

(58) Field of Classification Search ................ 427/348, 427/198, 355; 204/192.1
See application file for complete search history.

(56) References Cited

U.S. PATENT DOCUMENTS

| | | | | |
|---|---|---|---|---|
| 4,312,900 A | * | 1/1982 | Simpson | ...................... 427/181 |
| 6,221,775 B1 | * | 4/2001 | Ference et al. | ............. 438/691 |
| 6,451,077 B1 | * | 9/2002 | Rosenflanz | ................... 51/309 |
| 6,557,378 B1 | * | 5/2003 | Takagi et al. | ................... 65/26 |
| 6,881,674 B1 | * | 4/2005 | Cadien et al. | .............. 438/691 |

FOREIGN PATENT DOCUMENTS

| | | |
|---|---|---|
| JP | A-4-115870 | 4/1992 |
| JP | B2 8-18163 | 2/1996 |
| JP | A-9-314468 | 12/1997 |
| JP | B1 3022519 | 1/2000 |
| JP | B2 3061041 | 4/2000 |
| JP | A-2001-207160 | 7/2001 |
| JP | B2 3232778 | 9/2001 |
| JP | A-2002-146515 | 5/2002 |

* cited by examiner

*Primary Examiner*—Bret Chen
(74) *Attorney, Agent, or Firm*—Oliff & Berridge, PLC

(57) ABSTRACT

A process of manufacturing a coated body including a substrate and a hard coating disposed on the substrate, wherein the hard coating has (a) a surface smoothed to have a roughness with maximum height Rz of not larger than 1.2 μm, and (b) recesses each of which has a size of 0.5–6.0 μm and is formed in the surface, the process including a surface smoothing step of smoothing a surface of the hard coating by using abrasive particles such that the smoothed surface has the roughness with the maximum height Rz of not larger than 1.2 μm and such that the recesses each having the size of 0.5–6.0 μm are formed in the surface of the hard coating, wherein each of the abrasive particles used in the surface smoothing step is provided by a spherical-shaped core body made of a rubber and having a particle size of 0.1–2.0 mm, and hard abrasive grains each having a size of #3000–#10000 and adhering to an outer surface of the spherical-shaped core body.

3 Claims, 10 Drawing Sheets

FIG. 1A
FIG. 1B
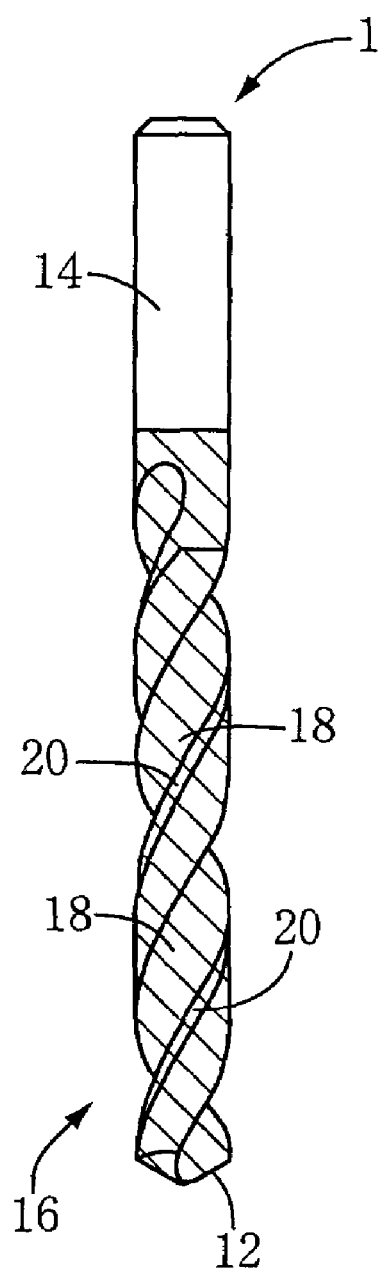
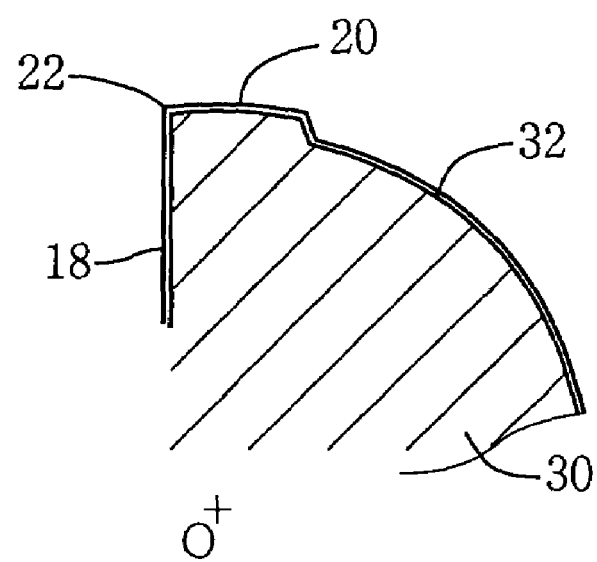

PHOTOGRAPH (×500) OF LEADING EDGE BEFORE SHOT BLASTING

PHOTOGRAPH (×500) OF LEADING EDGE AFTER SHOT BLASTING

PHOTOGRAPH (×2000) OF MARGIN BEFORE SHOT BLASTING

PHOTOGRAPH (×2000) OF MARGIN AFTER SHOT BLASTING

PHOTOGRAPH (×2000) OF FLUTE BEFORE SHOT BLASTING

PHOTOGRAPH (×2000) OF FLUTE AFTER SHOT BLASTING

FIG. 6A

| DRILL | SIZE | HARD COATING (TiCN) |
|---|---|---|
| No.1 | φ9.5 | COATING WITHOUT SHOT BLASTING |
| No.2 | φ9.5 | COATING WITH SHOT BLASTING TO DISTAL END PORTION |
| No.3 | φ9.5 | COATING WITH SHOT BLASTING TO ITS ENTIRETY |

FIG. 6B

| | CONDITION 1 | CONDITION 2 |
|---|---|---|
| WORK MATERIAL | S50C | SCM440(30HRC) |
| PERIPHERAL VELOCITY | 34m/min | 22m/min |
| FEED RATE | 0.21mm/rev | |
| DEPTH OF HOLE | 95mm (BLIND HOLE) | |
| DRILLING MODE | STEP DRILLING (WITH FIRST INFEED DEPTH OF 20mm) | |
| CUTTING FLUID | WATER SOLUBLE FLUID | |
| USED MACHINE | HORIZONTAL TYPE MACHINING CENTER | |

FIG. 6C

| | DRILL | NUMBER OF DRILLED HOLES |
|---|---|---|
| CONDITION 1 | No.1 | 120 |
| | No.2 | 268 |
| | No.3 | 226 |
| CONDITION 2 | No.1 | 54 |
| | No.2 | 85 |
| | No.3 | 95 |

FIG. 8A

| DRILL | SIZE | HARD COATING (TiCN) |
|---|---|---|
| No.1 | φ5 | NO COATING |
| No.2 | φ5 | COATING WITHOUT SHOT BLASTING |
| No.3 | φ5 | COATING WITH SHOT BLASTING TO ITS ENTIRETY |

FIG. 8B

| | CONDITION 3 | CONDITION 4 |
|---|---|---|
| WORK MATERIAL | S50C | SCM440 (30 H R C) |
| PERIPHERAL VELOCITY | 23m/min | 10m/min |
| FEED RATE | 0.1mm/rev | 0.09mm/rev |
| DEPTH OF HOLE | 48mm (BLIND HOLE) | |
| DRILLING MODE | STEP DRILLING (WITH FIRST INFEED DEPTH OF 25mm) | |
| CUTTING FLUID | WATER SOLUBLE FLUID | |
| USED MACHINE | HORIZONTAL TYPE MACHINING CENTER | |

FIG. 8C

| | DRILL | NUMBER OF DRILLED HOLES |
|---|---|---|
| CONDITION 3 | No.1 | 189 |
| CONDITION 3 | No.2 | 329 |
| CONDITION 3 | No.3 | 380 |
| CONDITION 4 | No.1 | 29 |
| CONDITION 4 | No.2 | 2 |
| CONDITION 4 | No.3 | 72 |

FIG. 9

| DRILL | | MEASURED PORTION | AFTER FORMATION OF FLUTE | AFTER FIRST SHOT-BLASTING | AFTER FORMATION OF COATING | AFTER SECOND SHOT-BLASTING | IMPROVEMENT RATIO |
|---|---|---|---|---|---|---|---|
| No. 7 | | MARGIN | 1.20 | 0.94 | 2.00 | 0.58 | 71% |
| | | FLUTE | 0.82 | 0.68 | 1.34 | 1.02 | 24% |
| No. 8 | | MARGIN | 1.22 | 0.54 | 1.38 | 0.86 | 38% |
| | | FLUTE | 1.22 | 0.48 | 1.30 | 1.06 | 18% |
| No. 9 | | MARGIN | 1.06 | 0.66 | 1.42 | 0.74 | 48% |
| | | FLUTE | 1.06 | 0.62 | 1.74 | 0.76 | 56% |

PROCESS OF MANUFACTURING A COATED BODY

BACKGROUND OF THE INVENTION

1. Field of the Invention

This invention relates in general to improvements in a coated body which is provided by a substrate and a hard coating disposed on the substrate.

2. Discussion of the Related Art

There is widely used a machining tool, such as a rotary cutting tool (e.g. drill and end mill), a non-rotary cutting tool (e.g., lathe tool) and a non-cutting tool (e.g., cold-forming tool, thread rolling tool and fluteless tap), which is used to machine a workpiece by moving at least one of the machining tool and the workpiece relative to the other. There has been proposed a technique for covering a substrate of the machining tool with a hard coating for increasing wear resistance and durability of the machining tool. JP-B2-3232778 (publication of Japanese Patent issued in 2001) discloses a shot blasting operation, which is carried out after formation of a hard coating on a tool substrate, for releasing residual or internal stress from the formed hard coating.

Although the coated machining tool exhibits excellent wear resistance and durability, there is still a demand for further improved wear resistance and durability of the machining tool, for satisfying a requirement for further increased machining efficiency and further prolonged tool life.

SUMMARY OF THE INVENTION

The present invention was made in view of the background prior art discussed above. It is therefore an object of the present invention to further improve the wear resistance and durability of the coated body.

It is common that so-called "macro particles" each having a size of about 0.5–6.0 µm are scattered, as shown in FIG. 4A and FIG. 5A, on the surface of a hard coating which is formed of TiCN or TiN in accordance with a PVD method. Various studies and experiments made by the inventors of the present invention revealed that a shot blasting with use of a certain abrasive material is effective not only to remove the macro particles from the surface of the hard coating but also to form dimples or recesses in the surface of the hard coating, wherein the certain abrasive material is constituted by abrasive particles each of which is provided by a soft core body having a size of 0.5–2.0 mm, and diamond abrasive grains each having a size of #3000–#6000 and adhering to an outer surface of the soft core body. That is, when the shot blasting was effected with these abrasive particles blown under an air pressure of about 0.5 MPa, the surface of the hard coating was smoothed to have a roughness with maximum height Rz of not larger than 1.2 µm, while at the same time dimples or recesses each having a size of 1–5 µm are formed in the surface of the hard coating, as shown in FIG. 4B and FIG. 5B. It was then found that the dimples or recesses scattered in the hard coating surface serve as so-called "oil pools" for retaining a fluid such as a coolant fluid, cutting fluid and lubricant oil, thereby further improving the wear resistance and durability of the coated body.

The present invention was developed based on the above-described finding. The above-described object of the invention may be achieved according to any one of the first through ninth aspects of the invention which are described below.

The first aspect of this invention provides a coated body comprising: a substrate; and a hard coating disposed on the substrate, wherein the hard coating has (a) a surface smoothed to have a roughness with maximum height Rz of not larger than 1.2 µm, and (b) dimples or recesses each of which has a size of 0.5–6.0 µm and is formed in the surface.

In the coated body defined in the first aspect of the invention, the hard coating may have, in addition to the recesses each having the size of 0.5–6.0 µm, recesses each having a size of smaller than 0.5 µm and recesses each having a size of larger than 6.0 µm, as in a coated body shown in FIG. 4B and FIG. 5B in which various sized recesses are scattered on its surface.

According to the second aspect of the invention, in the coated body defined in the first aspect of the invention, the substrate is formed of a high speed tool steel, wherein the hard coating is formed of a solid solution including at least one of carbide, nitride and carbon nitride each of which includes at least one of metals which belong to respective groups IIIb, IVa, Va and VIa of the periodic table.

According to the third aspect of the invention, in the coated body defined in the first or second aspect of the invention, the substrate is formed of a cemented carbide, wherein the hard coating is formed of a solid solution including at least one of carbide, nitride and carbon nitride each of which includes at least one of metals which belong to respective groups IIIb, IVa, Va and VIa of the periodic table.

According to the fourth aspect of the invention, the coated body defined in any one of the first through third aspects of the invention consists of a machining tool which is to be moved relative to a workpiece, for thereby machining the workpiece.

According to the fifth aspect of the invention, in the coated body defined in the fourth aspect of the invention, the machining tool is a drill.

According to the sixth aspect of the invention, in the coated body defined in the fourth aspect of the invention, the machining tool is an end mill.

The seventh aspect of the invention provides a process of manufacturing the coated body defined in any one of the first through sixth aspects of the invention, the process comprising: a surface smoothing step of smoothing a surface of the hard coating by using abrasive particles such that the smoothed surface has the roughness with the maximum height Rz of not larger than 1.2 µm and such that the recesses each having the size of 0.5–6.0 µm are formed in the surface of the hard coating, wherein each of the abrasive particles used in the surface smoothing step is provided by a soft core body having a size of 0.1–2.0 mm, and hard abrasive grains each having a size of #3000–#10000 and adhering to an outer surface of the soft core body.

According to the eighth aspect of the invention, in the manufacturing process defined in the seventh aspect of the invention, the surface smoothing step is implemented by a shot blasting operation in which the abrasive particles are applied to the surface of the hard coating.

According to the ninth aspect of the invention, the manufacturing process defined in the seventh or eighth aspect of the invention further comprises: a coating forming step of forming the hard coating on the substrate in accordance with a PVD method such that the hard coating is provided by a solid solution including at least one of carbide, nitride and carbon nitride each of which includes at least one of metals which belong to respective groups IIIb, IVa, Va and VIa of the periodic table, wherein the surface smoothing step is implemented to eliminate macro particles which have been generated on the surface of the hard coating in the coating forming step, such that the surface has the roughness with the maximum height Rz of not larger than 1.2 μm and such that the recesses each having the size of 0.5–6.0 μm are formed in the surface of the hard coating.

In the coated body defined in any one of the first through sixth aspects of the invention, the hard coating has the surface smoothed to have the roughness with the maximum height Rz of not larger than 1.2 μm, and the dimples or recesses each of which has the size of 0.5–6.0 μm and is formed in the surface. The dimples or recesses serve as oil pools for retaining a fluid such as a coolant fluid, cutting fluid and lubricant oil, and cooperate with the smoothed surface to further improve the wear resistance and durability of the coated body.

The coated body defined in the first aspect of the invention can be advantageously manufactured in the process defined in any one of the seventh through ninth aspects of the invention. Thus, the process defined in any one of the seventh through ninth aspects of the invention provides the same technical advantages as the coated body defined in the first aspect of the invention.

The principle of the present invention is advantageously applicable to a coated machining tool, such as a rotary cutting tool (e.g. drill and end mill), a non-rotary cutting tool (e.g., lathe tool) and a non-cutting tool (e.g., cold-forming tool, thread rolling tool and fluteless tap), which is used to machine a workpiece by moving at least one of the machining tool and the workpiece relative to the other. However, the principle of the invention is also applicable to a non-machining tool, i.e., other coated body such as a bearing that is required to have high degrees of wear resistance and durability. Where the principle of the invention is applied to the cutting tool, the hard coating having the smoothed surface and recesses can be disposed not only on lands of the tool but also on chip evacuation flutes of the tool, for thereby improving performance of chip evacuation and accordingly preventing chip packing. The easy evacuation of the chips leads to a reduction in a thrust load applied to the cutting tool.

While the substrate is preferably formed of cemented carbide or high-speed steel, the substrate may be formed of any other kind of material such as a hard tool material other than the cemented carbide.

The hard coating is preferably made of a solid solution including at least one of carbide, nitride and carbon nitride each of which includes at least one of metals belonging to respective groups IIIb, IVa, Va and VIa of the periodic table. The metal belonging to the group IIIb, IVa, Va or VIa may be, for example, Al, Ti, V or Cr. The solid solution may be, for example, TiAlN, TiCN, TiCrN or TiN. The hard coating may be provided by either a single layer or a plurality of layers. The thickness of the hard coating may be suitably determined depending upon the kind of coated body, kind of coating and kind of work material that is to be machined with the coated body in the form of a machining tool. For example, where the coated body is provided by a cutting tool such as a drill while the hard coating is formed of TiCN, the cutting tool can be given a sufficiently high degree of wear resistance even if the thickness of the hard coating is smaller than 10 μm, e.g., as small as about 1–5 μm.

While the hard coating is preferably formed in accordance with a PVD method such as arc ion plating method and sputtering method, the hard coating may be formed in accordance with any other method.

The soft core body of each of the abrasive particles used in the surface smoothing step is preferably formed of an elastic body such as a rubber, and preferably has a spherical shape or other three-dimensional shape which is suitable for a substantially even formation of the hard abrasive grains over the entirety of outer surface of the core body. While the hard abrasive grains are preferably provided by diamond abrasive grains, the hard abrasive grains may be formed of other kind of hard abrasive grains such as CBN (cubic boron nitrides) abrasive grains.

The abrasive particles may be prepared, by mixing the soft core bodies and the hard abrasive grains with a suitable liquid under stirring, so that the hard abrasive grains adhere to the outer circumferential surface of each soft core body. The thus prepared abrasive particles may be blown onto the surface of the hard coating, under an air pressure of about 0.1–1.0 MPa. It is noted that a length of time, for which the abrasive grains are blown or applied onto the surface of the hard coating, may be determined depending upon various factor such as an area of the hard coating surface, such that the surface has a desired roughness and recesses each having a desired size.

The size of each of the recesses is preferably 0.5–6.0 μm, more preferably 1.0–5.0 μm. If the size of each recess were smaller than 0.5 μm, each recess would not be capable of satisfactorily retaining a fluid. If the size of each recess were larger than 6.0 μm, it would be difficult to obtain a required smoothness of the surface of the hard coating. It is noted that the size of each recess varies depending upon the size of each macro particle and condition under which the surface smoothing operation is effected.

It is preferable that the entirety of the hard coating is subjected to the surface smoothing operation. However, where the coated body is provided by a cutting tool, only a selected portion of the hard coating, such as a portion covering a cutting edge, a rake face or a flank face, may be subjected to the surface smoothing operation. The selected portion may be determined suitably depending upon the kind of tool.

BRIEF DESCRIPTION OF THE DRAWINGS

The above and other objects, features, advantages and technical and industrial significance of this invention will be better understood by reading the following detailed description of the presently preferred embodiments of the invention, when considered in connection with the accompanying drawings, in which:

FIG. 1A is a front elevational view of a dill constructed according to an embodiment of the invention;

FIG. 1B is a fragmentary view in transverse cross section of the drill of FIG. 1A, which section is perpendicular to an axis of the drill;

FIG. 6A is a table indicating drills each having a diameter of 9.5 mm and used in a test for seeing durability of each of the drills;

FIG. 6B is a table specifying drilling conditions adopted in the test with the drills of FIG. 6A;

FIG. 6C is a table showing a result of the test with the drills of FIG. 6A;

FIG. 8A is a table indicating drills each having a diameter of 5 mm and used in a test for seeing durability of each of the drills;

FIG. 8B is a table specifying drilling conditions adopted in the test with the drills of FIG. 8A;

FIG. 8C is a table showing a result of the test with the drills of FIG. 8A;

FIG. 9 is a table showing change in a surface roughness of each of drills in a process of manufacturing the drill.

DETAILED DESCRIPTION OF THE PREFERRED EMBODIMENTS

Figure 2:
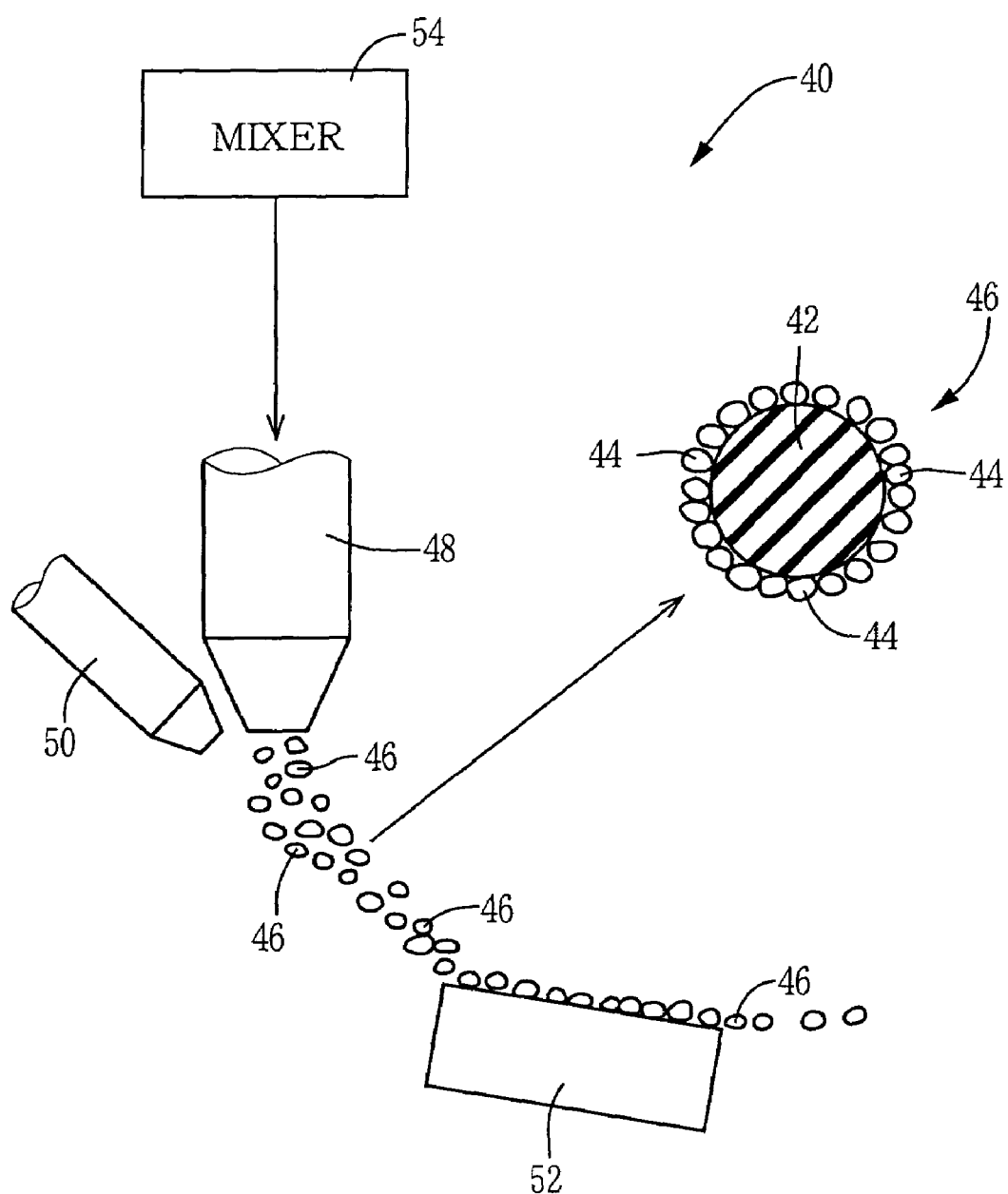
FIG. 2 is a schematic view for explaining a mechanism of a surface abrading device which is used for effecting a shot blasting operation in a process of manufacturing the drill of FIG. 1A.

FIGS. 1A and 1B show a coated body in the form of a drill 10 which is constructed according to an embodiment of this invention. FIG. 1A is a front elevational view of the drill 10 as seen in a direction perpendicular to an axis O of the drill 10. FIG. 1B is a fragmentary view in transverse cross section of the drill 10, which section is perpendicular to the axis O of the drill 10. This drill 10 is a two-fluted twist drill having a drill diameter of 9.5 mm, and includes a shank portion 14 and a fluted portion 16 which are coaxial with each other and which are formed integrally with each other. The fluted portion 16 has a pair of chip evacuation flutes 18 each of which is formed to extend from an axially distal end of the drill 10 toward the shank portion 14. Each of the flutes 18 is twisted in a clockwise direction by a predetermined helix angle with respect to the axis O. A pair of cutting lips or edges 12 are provided by axially distal ends of the respective flutes 18. The drill 10 is rotated in a predetermined rotating direction, i.e., in a clockwise direction as seen in a direction away from the shank portion 14 toward the axially distal end of the drill 10, while being axially moved toward a workpiece, so that the workpiece is cut by the cutting edges 12 whereby a hole is formed in the workpiece, while chips produced as a result of the cutting of the workpiece is evacuated from the hole toward the shank portion 14 via the chip evacuation flutes 18. It is noted that a margin 20 is located on a rear side of each of the flutes 18 as viewed in the above-described rotating direction of the drill 10 and extends along the flute 18.

The drill 10 as the coated body is provided by a substrate 30 made of a cemented carbide, and a hard coating 32 disposed on a selected portion of the substrate 30 which portion is represented by an oblique-lined portion in FIG. 1A. The selected portion substantially corresponds to the fluted portion 16, so that not only an axially distal end portion of the fluted portion 16 (providing rake and flank faces of the cutting edges 12) but also axially intermediate and proximal end portions of the fluted portion 16 (providing the flutes 18, margins 20 and body clearances) are coated with the hard coating 32. In the present embodiment, the hard coating 32 in the form of TiCN coating is formed in accordance with a PVD method such as arc ion plating method and sputtering method, so as to have a substantially constant thickness of 1–3 μm (preferably 2 μm).

Figure 3A:
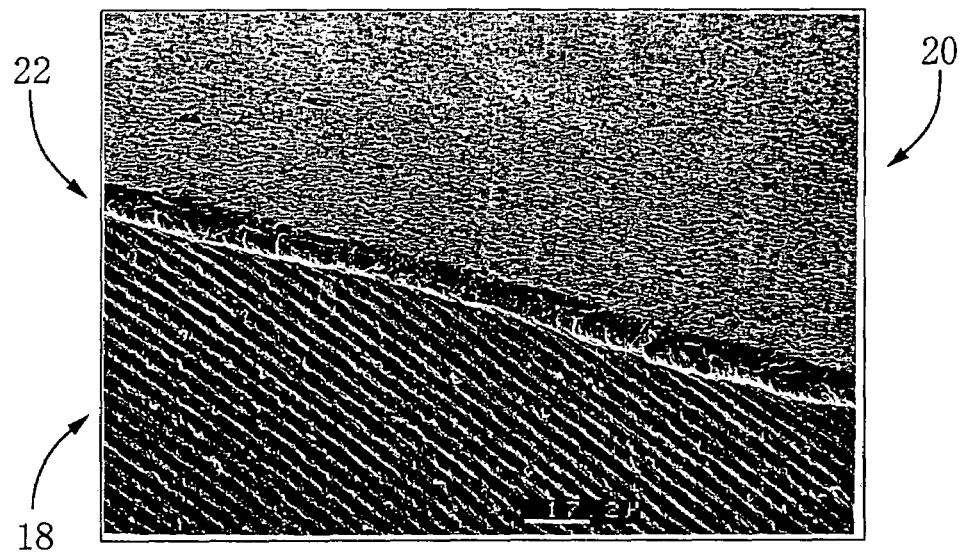
FIG. 3A is a microphotograph taken by an electron microscope with magnification of ×500, and showing a part of a leading edge of the drill of FIG. 1A before the shot blasting operation.
Figure 4A:
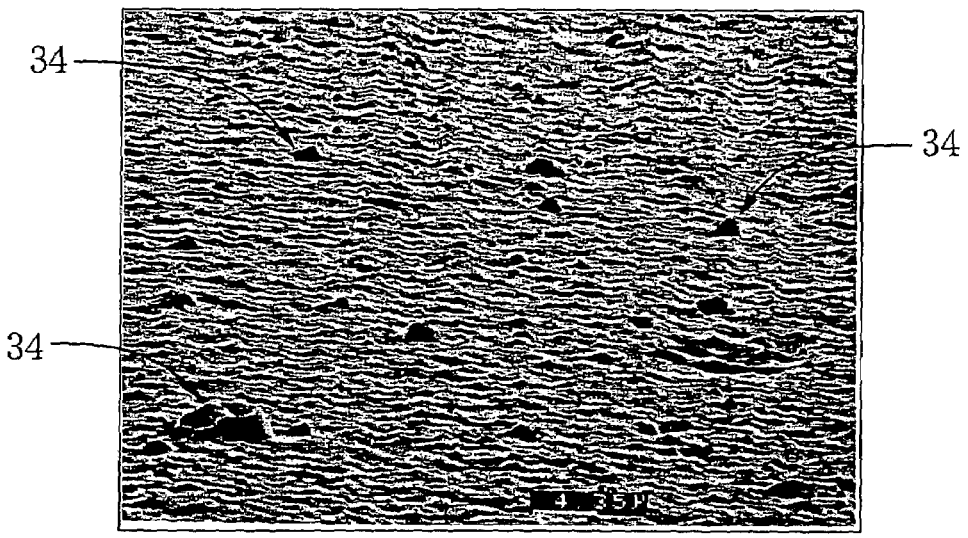
FIG. 4A is a microphotograph taken by the electron microscope with magnification of ×2000, and showing a part of a margin of the drill of FIG. 1A before the shot blasting operation.
Figure 5A:
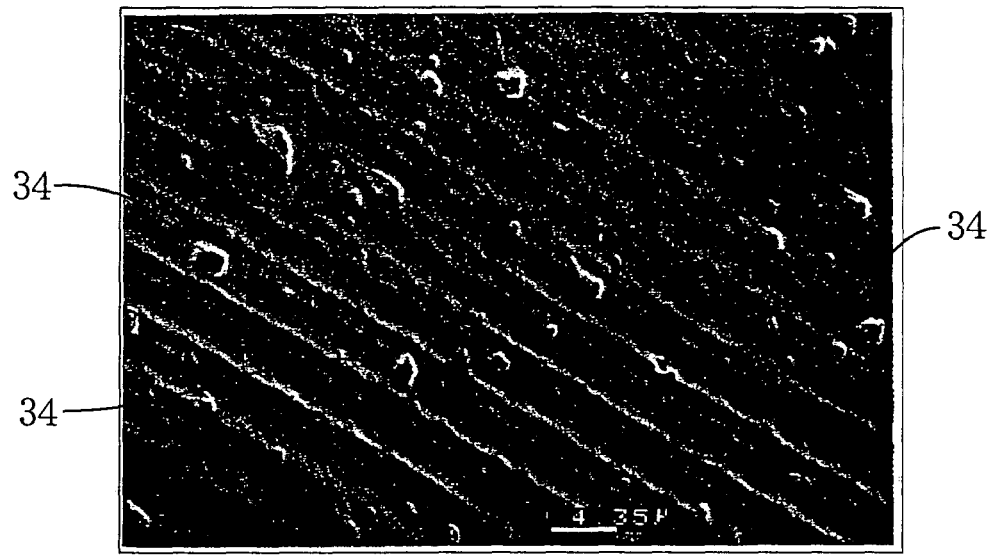
FIG. 5A is a microphotograph taken by the electron microscope with magnification of ×2000, and showing a part of a flute of the drill of FIG. 1A before the shot blasting operation.

FIGS. 3A, 4A and 5A are microphotographs showing respective portions of the fluted portion 16, and taken by an electron microscope after the hard coating 32 is formed on the substrate 30. The microphotograph of FIG. 3A is taken with a magnification of ×500, and shows a part of a leading edge 22 which is defined by an intersection of the flute 18 and the margin 20. The microphotograph of FIG. 4A is taken with a magnification of ×2000, and shows a part of the margin 20. The microphotograph of FIG. 5A is taken with a magnification of ×2000, and shows a part of the flute 18. As shown in FIGS. 4A and 5A, macro particles 34 each having a size of about 0.5–6.0 μm are scattered on the surface of the hard coating 32 such that each of the macro particles 34 protrudes from the surface of the hard coating 32. As best shown in FIG. 3A, the flute 18 has, on its surface, a striped pattern which is generated when the flute 18 is finished by a grinding wheel.

After the formation of the hard coating 32 on the substrate 30, a shot blasting operation is effected on the entirety of the surface of the hard coating 32, by using suitable abrasive particles 46 in a surface abrading device 40 as shown in FIG. 2, whereby the macro particles 34 are removed from the hard coating 32. Each of the abrasive particles 46 is provided by a soft core body 42 consisting of a rubber-made spherical body having a diameter of 0.5–2.0 mm, and diamond abrasive grains 44 each having a size of #3000–#6000 and adhering to an outer surface of the soft core body 42. In the shot blasting operation with the surface abrading device 40, the abrasive particles 46 are supplied from a supply nozzle 48 at a predetermined rate, while a pressurized air having a pressure of about 0.5 MPa is ejected from an ejection nozzle 50, so that the abrasive particles 46 are blown onto a workpiece 52 (which corresponds to the substrate 30 coated with the hard coating 32), whereby a surface of the workpiece 52 is abraded or smoothed in a mechanical manner. The abrasive particles 46 are prepared, by mixing the soft core bodies 42 and the diamond abrasive grains 44 with a suitable liquid under stirring in a mixer 54, so that the multiplicity of diamond abrasive grains 44 adhere to the entirety of the outer surface of each soft core body 42. The thus prepared abrasive particles 46 are supplied through the supply nozzle 48. It should be noted that FIG. 2 does not necessarily show the soft core body 42 and the diamond abrasive grains 44 of the abrasive particle 46, with exact representation of ratios of their dimensions.

Figure 3B:
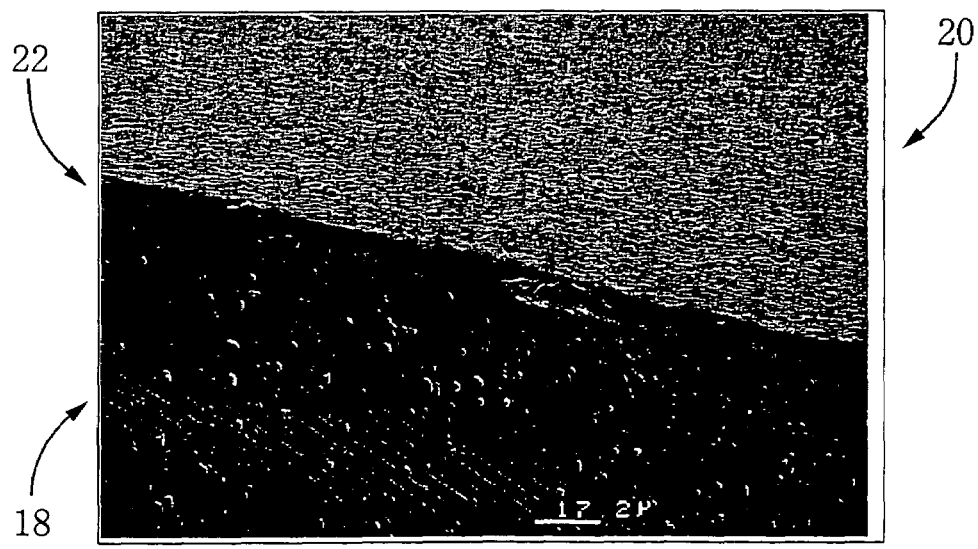
FIG. 3B is a microphotograph taken by the electron microscope with magnification of ×500, and showing the same part as FIG. 3A after the shot blasting operation.
Figure 4B:
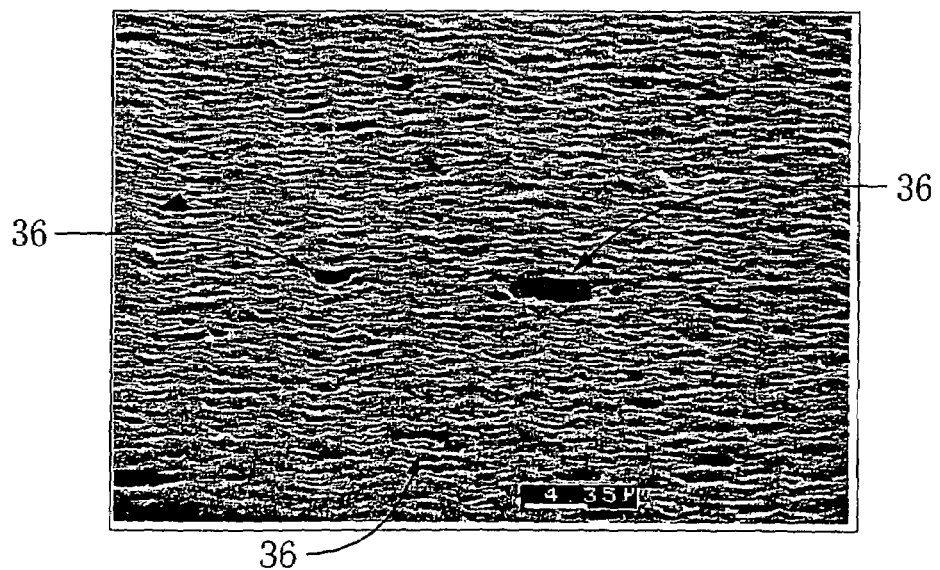
FIG. 4B is a microphotograph taken by the electron microscope with magnification of ×2000, and showing the same part as FIG. 4A after the shot blasting operation.
Figure 5B:
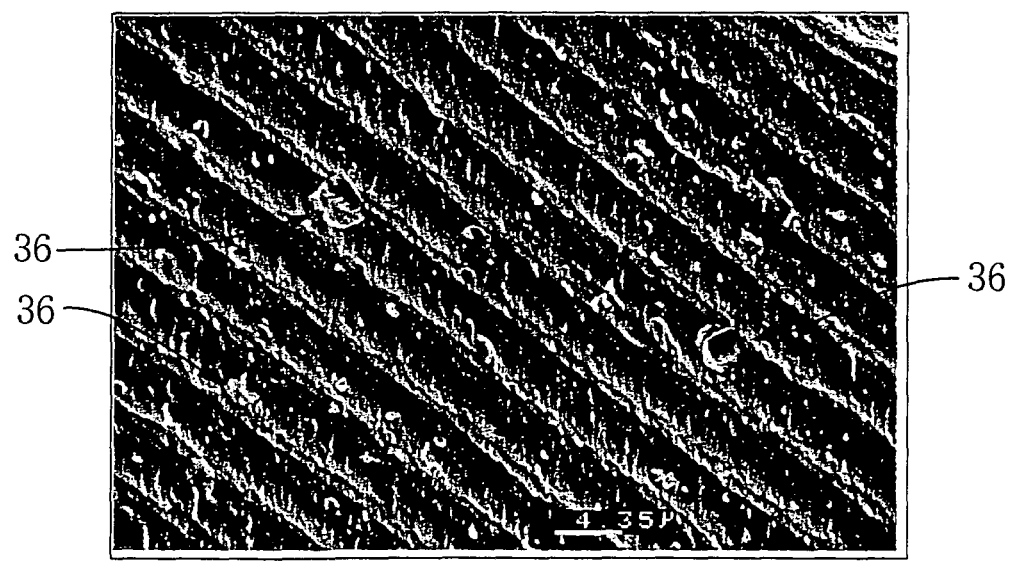
FIG. 5B is a microphotograph taken by the electron microscope with magnification of ×2000, and showing the same part as FIG. 5A after the shot blasting operation.

Owing to the shot blasting operation effected on the entirety of the surface of the hard coating 32, the above-described macro particles 34 are removed from the surface, whereby the surface is smoothed to have a roughness of not larger than 1.2 μm as expressed in terms of the maximum height Rz, while at the same time a multiplicity of recesses 36 each having a diameter of 1–5 μm are formed to be scattered in the surface, as shown in FIG. 4B and FIG. 5B. It is considered that the recesses 36 are formed as a result of the removals of the macro particles 34 from the hard coating 32 in the shot blasting operation. A condition for the shot blasting operation, such as the pressure of the ejected air, the amount of the supplied abrasive particles 46 and the length of the operation time, is determined depending upon various factor such as an area of the surface subjected to the shot blasting operation, such that the surface has a desired roughness and recesses each having a desired size. It is noted that FIG. 3B is a microphotograph taken with magnification of ×500, and showing the same part as FIG. 3A after the shot blasting operation.

In the drill 10 constructed as described above, the hard coating 32 has the surface smoothed to have the roughness with the maximum height Rz of not larger than 1.2 µm, and the dimples or recesses 36 each of which has the size of 0.5–6.0 µm and is formed in the surface. The recesses 36 serve as oil pools for retaining a fluid such as a coolant fluid, cutting fluid and lubricant oil, and cooperate with the smoothed surface to further improve the wear resistance and durability of the drill 10 and also facilitate chip evacuation. The easy chip evacuation, i.e., effective prevention of chip packing leads to a thrust load acting on the drill 10.

A durability test was conducted by using drills Nos. 1–3 each having a drill diameter of 9.5 mm as shown in FIG. 6A. The drill No. 1 was a conventional drill in which its substrate (identical with the above-described substrate 30 made of the cemented carbide) was coated with TiCN coating that had not been subjected to the above-described shot blasting operation. Each of the drills Nos. 2 and 3 was a drill constructed according to the invention in which its substrate (identical with the above-described substrate 30) was coated with TiCN coating that had been subjected to the above-described shot blasting operation. The drills Nos. 2 and 3 were different from each other in that the shot blasting operation had been effected on only a limited portion of the TiCN coating in the manufacturing process of the drill No. 2 while the shot blasting operation had been effected on the entirety of the TiCN coating in the manufacturing process of the drill No. 3. That is, in the drill No. 2, only the portion of the TiCN coating located on the axially distal end portion (including the rake and flank faces) of the fluted portion was subjected to the shot blasting operation. In the drill No. 3 which is identical with the drill 10 of the above-described embodiment of the invention, the entirety of the TiCN coating covering the fluted portion was subjected to the shot blasting operation. In the test, two different work materials of S50C (carbon steel) and SCM440 (heat-treated steel) are drilled under respective conditions 1 and 2 as shown in FIG. 6B, for checking durability of each drill by seeing the number of holes which were formed successively until the drill became incapable due to excessive amount of wear of the cutting edges. As shown in FIG. 6C, in the drilling operation performed on the work material of S50C under the condition 1, the number of the holes formed by each of the drills Nos. 2 and 3 was about twice the number of the holes formed by the drill No. 1. In the drilling operation on the work material of SCM440 under the condition 2, the number of the holes formed by each of the drills Nos. 2 and 3 was about 1.5 times the number of the holes formed by the drill No. 1. In the test, the drills Nos. 2 and 3 of the present invention thus exhibited a durability remarkably improved over that of the conventional drill No. 1. There was no large difference between the drills Nos. 2 and 3 in the durability, i.e., in the number of the formed holes.

Figure 7A:
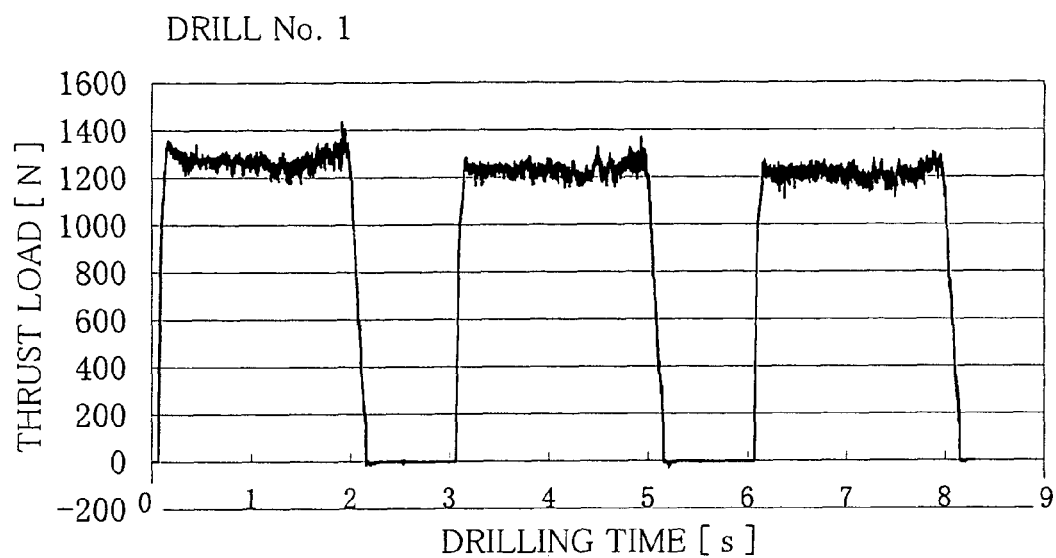
FIG. 7A is a graph showing a thrust load applied to the drill No. 1 of FIG. 6A during its drilling operation.
Figure 7B:
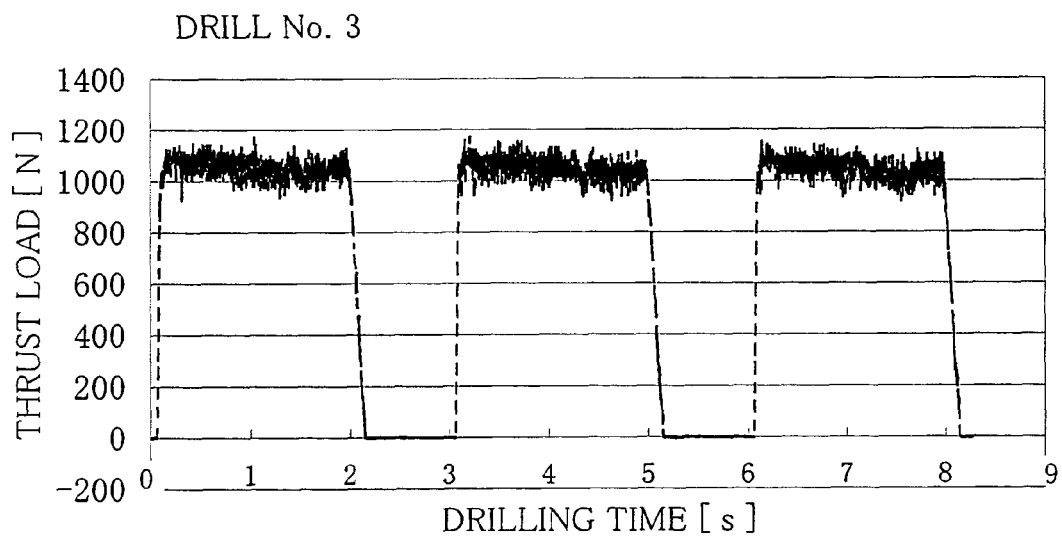
FIG. 7B is a graph showing a thrust load applied to the drill No. 3 of FIG. 6A during its drilling operation.

Another test was conducted by using the above-described drills No. 1 and No. 3 of the invention, for measuring a thrust load applied to each of the drills Nos. 1 and 3 in a drilling operation in which a blind hole having a depth of 25 mm was formed in a work material of SCM440 with a peripheral velocity V of 80 m/min and a feed rate f of 0.18 mm/rev. FIG. 7A is a graph showing the thrust load applied to the conventional drill No. 1 during the drilling operation, while FIG. 7B is a graph showing the thrust load applied to the drill No. 3 of the invention during the drilling operation. As shown in FIGS. 7A and 7B, the thrust load applied to the drill No. 3 is smaller than that applied to the drill No. 1 by more than 10%. It is noted that the drilling operation of this test was effected with a so-called "step drilling" (i.e., feeding the drill in an intermittent manner), as in the above-described test.

Another durability test was conducted by using drills Nos. 4–6 each having a drill diameter of 5 mm as shown in FIG. 8A. The drill No. 4 was a conventional drill which was provided by only a substrate (identical with the above-described substrate 30) without TiCN coating. The drill No. 5 was a conventional drill in which its substrate (identical with the above-described substrate 30) was coated with TiCN coating that had not been subjected to the above-described shot blasting operation. The drill No. 6 was a drill constructed according to the invention in which its substrate (identical with the above-described substrate 30) was coated with TiCN coating whose entire surface had been subjected to the above-described shot blasting operation. In the test, two different work materials of S50C and SCM440 are drilled under respective conditions 3 and 4 as shown in FIG. 8B, for checking durability of each drill by seeing the number of holes which were formed successively until the drill became incapable due to excessive amount of wear of the cutting edges. As shown in FIG. 8C, in the drilling operation performed on the work material of S50C under the condition 3, the number of the holes formed by the drill No. 6 of the invention was about twice the number of the holes formed by the conventional drill No. 4, and was larger than the number of the holes formed by the conventional drill No. 5, by about 15%. In the drilling operation on the work material of SCM440 under the condition 4, the number of the holes formed by the drill No. 6 of the invention was more than twice the number of the holes formed by the conventional drill No. 4, and was considerably larger than the number of the holes formed by the conventional drill No. 5. The number of the holes formed by the conventional drill No. 5 was only two that is still smaller than that formed by the conventional drill No. 4 (non-coated drill). It is considered that the condition No. 4 was not favorable for the drill No. 5 which had a relatively large degree of surface roughness due to the TiCN coating that had not been subjected to the above-described shot blasting operation.

A research was conducted to observe change in the surface roughness of drills in their respective manufacturing processes. FIG. 9 is a table showing change in the surface roughness of each of the drills Nos. 7–9 which was measured in a manufacturing process including: (a) a flute forming step of forming the flutes 18 in the substrate 30 in a grinding operation; (b) a first surface-smoothing step of smoothing the surface of the substrate 30 in a first shot-blasting operation effected with the surface abrading device 40; (c) a coating forming step of forming the TiCN coating 32 on the substrate 30 in accordance with a PVD method; and (d) a second surface-smoothing step of smoothing the surface of the coating 32 in a second shot-blasting operation effected with the surface abrading device 40. The table of FIG. 9 shows amounts of the surface roughness (maximum height Rz) measured at the margin 20 and the flute 18 of each of the drills Nos. 7–9 in each stage of the manufacturing process.

As shown in the table of FIG. 9, there was no large difference between the amount of the surface roughness measured at the margin 20 and that measured at the flute 18. Further, the table of FIG. 9 indicates that (i) the amount of the surface roughness was generally reduced by about ½ as a result of the first shot-blasting operation; that (ii) the amount of the surface roughness was generally increased as a result of the formation of the coating 32, to be larger than that was measured after the formation of the flutes 18; and that (iii) the amount of the surface roughness was generally reduced as a result of the second shot-blasting operation, to be smaller than that was measured after the formation of the flutes 18. The term "improvement ratio" is expressed by (Rz1–Rz2)/Rz1, where Rz1 represents the amount of the surface roughness measured after the formation of the coating 32 (before the second shot-blasting operation), while Rz2 represents the amount of the surface roughness measured after the second shot-blasting operation. Although the value of this improvement ratio varies from 18% to 71%, the value is a positive value rather than a negative value in all the cases (i.e., at the margin 20 and the flute 18 of each of the drills Nos. 7–9), namely, the surface roughness was improved owing to the second shot-blasting operation in all the cases. Thus, the amount of the surface roughness (maximum height Rz) measured after the second shot-blasting operation was not larger than 1.2 µm in all the cases.

Another research was conducted to see the surface roughness of drills each manufactured according to a process in which the first shot-blasting operation was not effected while the second shot-blasting operation was effected. There was no substantial deterioration in the surface roughness of each drill measured after the second-blasting operation in this process, in spite of the absence of the first shot-blasting operation. In other words, there was no large difference between the surface smoothness eventually obtained in this manufacturing process and the surface smoothness eventually obtained in the manufacturing process of FIG. 9. That is, the research revealed that it is possible to obtain the technical advantage of the invention, namely, to obtain a sufficiently high degree of surface smoothness even where the shot-blasting operating was effected only after the formation of the hard coating on the substrate.

Figure 10:
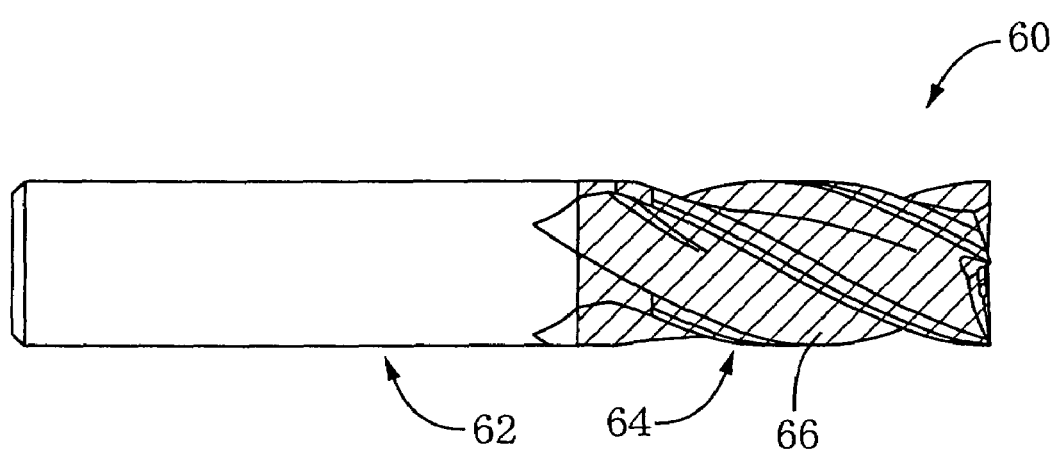
FIG. 10 is a view of an end mill constructed according to another embodiment of the invention.

FIG. 10 shows a coated body in the form of an end mill 60 which is constructed according to another embodiment of the invention. This end mill 60 includes a shank portion 62 and a fluted portion 64 which has a plurality of flutes 66 each formed to extend from an axially distal end of the end mill 60 toward the shank portion 62. The end mill 60 is provided by a substrate made of a cemented carbide, and a hard coating disposed on a selected portion of the substrate which portion is represented by an oblique-lined portion in FIG. 10. In a process of manufacturing the end mill 60, a shot blasting operation is effected on the entirety of the surface of the hard coating in the same manner as in the above-described process of manufacturing the drill 10, such that the hard coating has the surface smoothed to have the roughness with the maximum height Rz of not larger than 1.2 µm, and the recesses each of which has the size of 0.5–6.0 µm and is formed in the surface.

While the presently preferred embodiments of the present invention have been illustrated above, it is to be understood that the invention is not limited to the details of the illustrated embodiments, but may be embodied with various other changes, modifications and improvements, which may occur to those skilled in the art, without departing from the spirit and scope of the invention defined in the following claims.

What is claimed is:

1. A process of manufacturing a coated body comprising a substrate and a hard coating disposed on said substrate, wherein said hard coating has (a) a surface smoothed to have a roughness with maximum height Rz of not larger than 1.2 µm, and (b) recesses each of which has a size of 0.5–6.0 µm and is formed in said surface, said process comprising:

a surface smoothing step of smoothing a surface of said hard coating by using abrasive particles such that the smoothed surface has the roughness with the maximum height Rz of not larger than 1.2 µm and such that said recesses each having the size of 0.5–6.0 µm are formed in said surface of said hard coating, wherein each of said abrasive particles used in said surface smoothing step is provided by a spherical-shaped core body made of a rubber and having a particle size of 0.1–2.0 mm, and hard abrasive grains each having a size of #3000–#10000 and adhering to an outer surface of said spherical-shaped core body.

2. A process according to claim 1, wherein said surface smoothing step is implemented by a shot blasting operation in which said abrasive particles are applied to said surface of said hard coating.

3. A process according to claim 1, further comprising:

a coating forming step of forming said hard coating on said substrate in accordance with a PVD method such that said hard coating is provided by a solid solution including at least one of carbide, nitride and carbon nitride each of which includes at least one of metals which belong to respective groups IIIb, IVa, Va and VIa of the periodic table, wherein said surface smoothing step is implemented to eliminate particles each of which has a size of 0.5–6.0 µm and has been generated on said surface of said hard coating in said coating forming step.

\* \* \* \* \*